(12) United States Patent
Becer et al.

(10) Patent No.: US 7,251,797 B2
(45) Date of Patent: Jul. 31, 2007

(54) PESSIMISM REDUCTION IN CROSSTALK NOISE AWARE STATIC TIMING ANALYSIS

(75) Inventors: Murat R. Becer, Cedar Park, TX (US); Ilan Algor, Gnei-Tikva (IL); Amir Grinshpon, Tel Aviv (IL); Rafi Levy, Tel-Aviv (IL); Chanhee Oh, Austin, TX (US); Rajendran V. Panda, Round Rock, TX (US); Vladimir P. Zolotov, Putnam Valley, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 296 days.

(21) Appl. No.: 10/994,858

(22) Filed: Nov. 22, 2004

(65) Prior Publication Data

US 2006/0112359 A1 May 25, 2006

(51) Int. Cl.
*G06F 17/50* (2006.01)

(52) U.S. Cl. .............................. 716/6; 716/2
(58) Field of Classification Search .................. 716/2, 716/6
See application file for complete search history.

(56) References Cited

U.S. PATENT DOCUMENTS

| | | | |
|---|---|---|---|
| 6,405,348 B1 | 6/2002 | Fallah-Tehrani et al. |
| 6,405,350 B1 | 6/2002 | Tawada |
| 6,414,542 B2 | 7/2002 | Lin et al. |
| 6,510,540 B1 | 1/2003 | Krauter et al. |
| 6,587,815 B1 | 7/2003 | Aingaran et al. |
| 6,615,395 B1 | 9/2003 | Hathaway et al. |
| 6,637,014 B2 | 10/2003 | Casavant |
| 6,651,229 B2 | 11/2003 | Allen et al. |
| 6,665,845 B1 | 12/2003 | Aingaran et al. |
| 2002/0166101 A1* | 11/2002 | Casavant .................... 716/6 |
| 2003/0070150 A1* | 4/2003 | Allen et al. ................. 716/6 |

\* cited by examiner

*Primary Examiner*—Stacy A Whitmore
(74) *Attorney, Agent, or Firm*—Charles W. Bethards (57) ABSTRACT

Processes and systems (300) for reducing pessimism in cross talk noise aware static timing analysis and thus resulting false path failures use either or both of effective delta delay noise (307) and path based delay noise (311) analysis. Effective delta delay determines an impact (312, 314, 316) on victim timing of an action by aggressors that occur during a region (209, 319, 321) where victim and aggressor timing windows overlap and determines an effective delta delay 317 corresponding to any portion 316 of the impact on victim timing that extends beyond the victim timing window. The effective delta delay is used to adjust the victim timing window. Path based delta delay determines an uncertainty (627, 637) in a switching time corresponding to a particular path for a victim resulting from an action (switching) by aggressors that occurs at the switching time 607, 613, i.e. during a switching time window (a2 to a2+u1) (613, 625) when uncertainty is included.

22 Claims, 4 Drawing Sheets

|  | TDN | EDN | PBDN |
|---|---|---|---|
| AVERAGE PATH $\Delta_{DELAY}$ | 0.437 ns | 0.271 ns | 0.121 ns |
| WORST SLACK | -0.819 ns | -0.615 ns | -0.185 ns |
| NUMBER OF FAILING PATHS | 12843 | 12062 | 5490 |

FIG. 7

PESSIMISM REDUCTION IN CROSSTALK NOISE AWARE STATIC TIMING ANALYSIS

FIELD OF THE INVENTION

This invention relates in general to semiconductor layout analysis and more specifically to techniques for reducing pessimism in static timing analysis that considers crosstalk noise.

BACKGROUND OF THE INVENTION

Crosstalk noise, such as capacitive crosstalk noise, continues to be a major concern for semiconductor integrated circuits (ICs). As the size, complexity, and operating or switching speeds of semiconductor ICs have increased while feature geometries have decreased, interconnect systems for such ICs have dramatically increased in complexity. In many situations this has increased the possible impact on timing due to noise resulting from parasitic capacitance within the interconnect system.

One approach that is used to analyze the impact of the parasitic capacitances is to model the interconnect system as an arrangement of nets (interconnections between gate outputs and interconnected gate inputs) inter coupled with parasitic capacitors. Static Timing Analysis (STA) is used to develop early and late arrival times (timing window) for each relevant net or node. This timing window is enlarged by a worst case assessment of crosstalk noise for both early and late arrival times using noise aware STA. This worst case timing window is used for timing analysis of all paths through the corresponding net and a list of paths that fail timing requirements are provided.

Designers of the IC then address the list of paths that fail timing analysis pursuant to resolving any timing issues. Unfortunately due to the pessimism, i.e. worst case approaches, of current noise aware STA many failed paths are found to be false failure indications and designer resources are needlessly wasted in addressing the false failures.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

In overview, the present disclosure concerns reducing pessimism in cross talk noise aware static timing analysis and thus reduce resources traditionally devoted to reviewing and attempting to resolve false timing problems that may be identified by current timing analysis systems. More particularly various inventive concepts and principles embodied in methods and apparatus for reducing pessimism in such timing analysis are discussed.

The concepts and principles described and disclosed will find application, for example as tools for use by designers and evaluators of semiconductor integrated circuits (ICs) and interconnect systems for such ICs. The practical utility of the concepts and principles will increase as the complexity and scale of ICs and interconnect systems increase while time to market pressures also increase.

As further discussed below, various inventive principles and combinations thereof are advantageously employed in an effective delta delay approach as well as a path based approach to determining practical worst case timing issues for ICs. Implementing one or both of these approaches has been shown to alleviate various problems, such as undue pessimism associated with known systems while still facilitating appropriate results for crosstalk noise aware static timing analysis provided these principles or equivalents thereof are utilized.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in software programs or instructions. It is expected that one of ordinary skill, notwithstanding possibly significant effort and many design choices motivated by, for example, available time, current technology, and economic considerations, when guided by the concepts and principles disclosed herein will be readily capable of generating such software instructions and programs with minimal experimentation. Therefore, in the interest of brevity and minimization of any risk of obscuring the principles and concepts according to the present invention, further discussion of such software, if any, will be limited to the essentials with respect to the principles and concepts of the exemplary embodiments.

Figure 1:
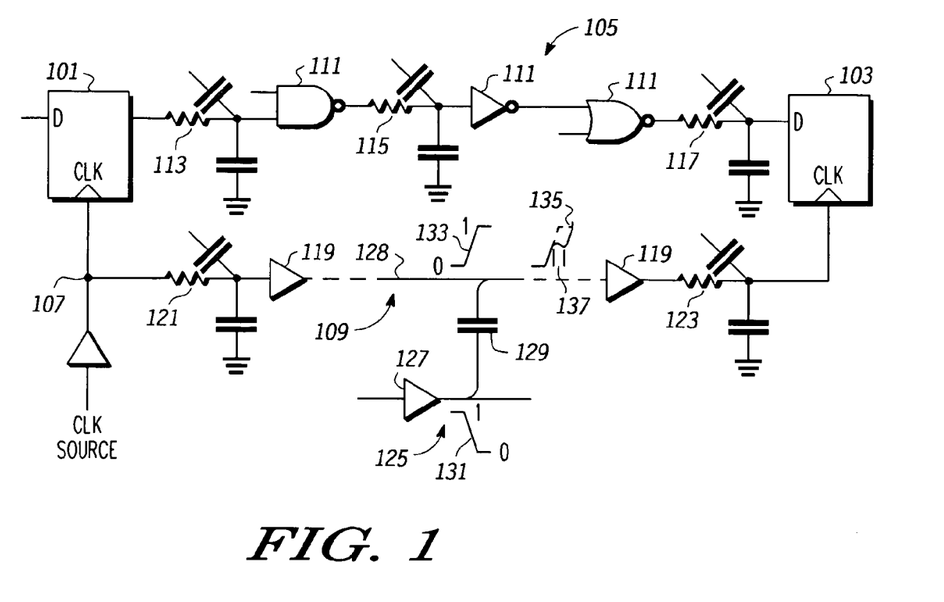
FIG. 1 depicts, in a simplified and representative form, a diagram of a circuit including signal paths and models of various interconnects.

Referring to FIG. 1 a simplified and representative diagram of an exemplary circuit including signal paths and models of various interconnects will be discussed and described. The discussion of FIG. 1 will introduce some definitions and concepts that will be useful for the balance of the disclosure. FIG. 1 shows a flip flop 101 to flip flop 103 signal path 105 along with its launch and capture clock paths 107, 109 as an example. These paths may have a number of intervening gates and interconnects, where interconnects (or connection or connection systems) between gates are referred to herein alternatively as nets. For example the signal path shows three intervening gates 111 and three nets 113, 115, 117 where of course there can be more that are not depicted. Notice also that many of the intervening gates have other inputs implying that other paths (series of nets and gates) may also traverse one or more of the nets 113, 115, 117. The capture clock path 109 shows intervening gates 119 and nets 121, 123.

Each of the nets as depicted is modeled as one or more series resistors, one or more series capacitors to ground as well as one or more coupling capacitor(s) (can be a plurality of such capacitors although only one is depicted). These elements are all parasitic elements that are modeled as lumped elements. The coupling capacitors are coupled to one or more other nets and thus give rise to cross talk noise as will be discussed. Generally STA considers delays and the like timing issues that can arise from the series resistors, capacitors to ground, and gate propagation delays and results in or provides an early arrival time and late arrival time or timing window at a point of interest, such as flip flop 103.

Also shown in FIG. 1 is another net or aggressor 125 that is coupled to an output of a gate 127 and coupled to a net or victim 128 in the capture clock path 109 by a coupling capacitor 129. Suppose the aggressor 125 experiences an action 131 or change from a logic 1 to logic 0 state concurrently with the victim changing or switching 133 from a 0 to a 1 logic state. The expected waveform on the victim or victim net may be as depicted by the dotted line of the waveform 135. Due to the coupling capacitor 129 the waveform 135 may appear as shown by the solid line as will be evident to those of ordinary skill. The additional delay between when the waveform 135 would have reached, for example, mid point and when it does reach mid point is referred to as a delta delay 137 and may result in a late arrival time further along the path. Note that if the aggressor and the victim are switching logic levels in the same direction the resultant waveform will actually reach mid point earlier than if the aggressor were not taking some action. This results in an early arrival time further along the path. Noise aware STA attempts to account for these effects with resultant assessments of delta delays being back annotated to the timing windows found from STA.

More generally, as earlier noted, capacitive crosstalk noise continues to be a critical design issue in both block level IC designs and at the chip integration level of, for example, SoC (system on chip) systems. At the block level, whether the design is a synthesized block, a custom macro or a dense memory (ROM/RAM) structure; it is necessary to design for and verify the functionality of the part with crosstalk noise taken into account. Even though the net lengths tend to be shorter in the block level designs, the reduced noise margin of low-voltage threshold devices, increased crosstalk capacitance to grounded capacitance ratio due to thick and narrow metals, and some strict requirements for certain signals (e.g., sense amplifier data and reference nets of memory designs) make crosstalk noise an important design parameter. On the other hand, in chip level designs, long routes between blocks and structured nature of buses running long distances in parallel increase the susceptibility of the top level nets to crosstalk noise. For analysis of crosstalk noise in synthesized blocks and chip level designs that consist of such blocks, typically a gate level crosstalk noise analysis tool such as those available from or referred to as one or more of Celtic, PTSI (Prime Time Signal Integrity), or proprietary tools can be employed. Digital gates are usually pre-characterized to reflect drive/holding strengths for the output pins and noise rejection/propagation properties for the input pins. Reduced order modeling techniques are often employed on the linearized networks of gates and coupled interconnects for improved performance. For custom blocks and memory designs, transistor level tools (Pacific and the like) may be utilized that can perform characterization and analysis in more or less real time.

However in part due to the static nature of crosstalk noise analysis tools, a lot of inherent pessimism exists in current industry tools. Logic correlations between aggressor and victim nets and temporal correlations in the form of pin timing windows have been utilized to reduce this pessimism to some level. This pessimism is reflected in the functional noise analysis as wider and taller noise pulses at the victim net receiver inputs. However, in functional noise analysis rather than crosstalk delay noise analysis, analysis tools propagate noise through the receivers and the failure criteria is usually defined either as a certain threshold at the receiver outputs of each stage or at the memory element (latch/flip-flop) termination of a signal path. This results in pessimism tolerance as the noise pulses can be attenuated through propagation. Thus, the introduced pessimism in the analysis does not tend to accumulate through a signal/clock path.

However in delay analysis due to crosstalk noise, this is not true. At each stage of the signal and clock path, introduced pessimism in the calculated delta delay accumulates though the path resulting in overly pessimistic noise aware STA results. This causes several unreal timing or false path failures which require design resources and time to handle and result in unnecessary delays in tape out or final IC layout. It is thus very important to reduce pessimism in delay noise analysis.

In cross talk noise free static timing analysis, early and late arrival times (timing windows) as well as minimum and maximum transition times are obtained for each node in the circuit where a node can be a sequential/combinational gate input/output or primary input/output. At the timing check points (i.e., memory element inputs and primary outputs) the early and late arrival times of the propagated timing windows are compared against the required times (which are decided by the timing constraints of the design) and a decision is made whether there are setup/hold problems at these end points, such as the flip flop 103. Gate input/outputs can be referred to as pins whereas the primary inputs/outputs are often referred to as ports. As noted above a net represents an interconnect in the circuit which connects ports and pins (e.g., gate outputs to gate inputs; primary inputs to gate inputs; gate outputs to primary outputs). A timing path or path is a collection of pins, ports, gates, and nets which starts at a primary input or a memory element output pin (for example, flip flop 101) and ends at a primary output or at a memory element data input pin (for example, flip flop 103). FIG. 1, briefly discussed above, shows a flip-flop 101 to flip-flop 103 signal path along with its launch and capture clock paths as an example. The crosstalk noise free timing windows exist since each pin can be part of multiple paths that are going through it, where some paths are faster than others, therefore resulting in possible early and late switching times for each pin. These windows can be large depending on the specific topology of the circuit.

The impact of crosstalk noise, i.e. interaction of nets on one another, is manifested as increases in late arrival times and decreases in early arrival times of timing windows such as provided by STA, thus making it harder to satisfy timing constraints. Conventional noise aware STA approaches the calculation of this impact on a net by net basis. Timing windows obtained from STA (usually driver output timing windows are obtained from STA and shifted by the RC delay to obtain fan-out timing windows during analysis) are used as a means to prune out aggressors or aggressor nets that cannot switch at the same time as the victim. A worst aligning (within themselves and the victim net) set of aggressor nets for each victim-aggressor transition combination (e.g., victim rising and aggressors falling for delay increase) is found. The delay increase/decrease at each victim net sink or pin due to this worst aggressor set is then back-annotated into STA simply by representing this information as min-delta_delay and max-delta_delay for each corresponding timing arc (driver output to a sink or input) of the victim net.

Figure 2:
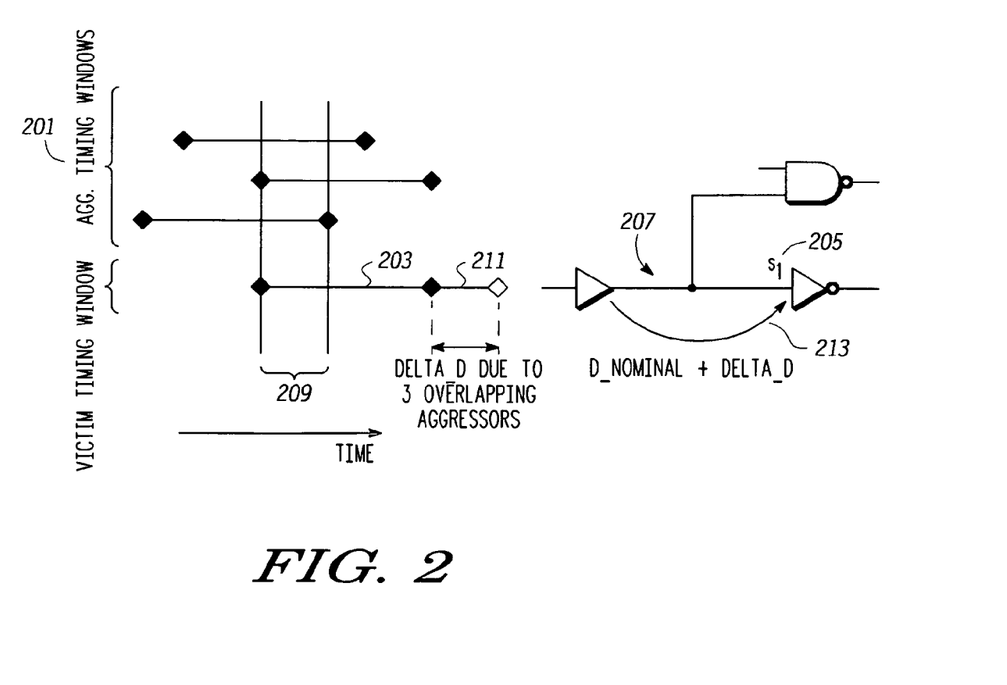
FIG. 2 depicts, in a simplified and representative form, a cross talk noise aware delta delay derivation.

This is illustrated in FIG. 2. Suppose that the aggressor timing windows 201 and victim timing window 203 in the figure correspond to victim low to high transition and aggressor high to low transitions (see FIG. 1) and that the victim and aggressor driver node windows have been shifted to represent possible switching times relevant to input s1 205 of the victim net 207. As can be seen, there is a region 209 where all 3 aggressor timing windows overlap with themselves and with that of the victim. This means that all three aggressors can switch together and impact the signal delay of the victim net. The worst case impact due to these three aggressors is then found by finding the "right" alignment between the switching times of these four nets such that the delay impact or delta delay 211 on the victim net is maximized (some approaches try to maximize delay change at the victim sink, whereas others aim to maximize delay change at the victim sink output after the signal propagates). Note that, this amounts to enlarging the timing window associated with this net that will be used in a STA analysis. This delta delay is then back-annotated to the corresponding timing arc 213 in STA as shown. Once this operation is done for each net in the design, a STA update is performed to account for the impact of the back-annotated delta delays. Note that for each interconnect timing arc, four delta delay numbers are back-annotated, two for delay increase and two for delay decrease. The STA update results in new timing windows and noise analysis is repeated using these modified timing windows and iterations continue until the timing windows converge. When the final STA update is done and timing checks are being performed, the corresponding delta delay value is chosen depending on the type of timing check being employed. For example for a setup analysis, the delta delays are utilized such that the launch clock and signal path delay are increased whereas the capture clock delay is decreased.

In the remainder of this disclosure, the discussion will refer to "net" timing windows instead of "pin" timing windows for ease of discussion. However, note that each net can have several sinks and therefore several shifted sink timing windows (and corresponding aggressor timing windows that are shifted to represent the times they impact each sink) as discussed above. Also the discussions will generally focus on delay increase (late arrival times) due to crosstalk noise while similar concepts and principles apply for delay decrease (earlier arrival times) as will be evident to one of ordinary skill given the present disclosure.

Figure 3:
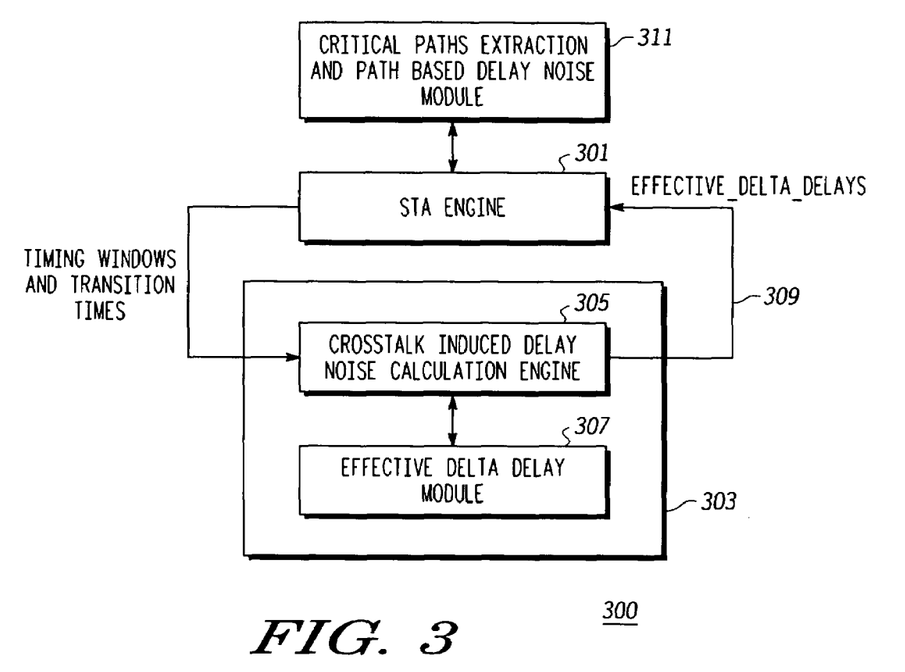
FIG. 3 illustrates in a simplified and representative form a functional diagram of a system for reducing pessimism in a crosstalk noise aware static timing analysis.

Referring to FIG. 3, a simplified and representative functional diagram of a system 300 and methodology for reducing pessimism, i.e. reducing false timing indications or problems, in or resulting from a crosstalk noise aware static timing analysis will be discussed and described. The system and methodology of FIG. 2 utilize a STA analysis engine that is, as known and not specifically depicted, provided with information regarding a semiconductor integrated circuit layout including an interconnect system as well as modeled grounded capacitances and series resistors. Further provided is a circuit description and timing library corresponding to various circuit cells that are utilized. Also various timing constraints and the like user inputs are provided. The STA analysis engine operates as generally described above. The STA engine provides static timing windows and transition times for the various nets and nodes in the interconnect system to a noise analysis function 303.

The noise analysis function 303 is also provided with IC layout information with various parasitic capacitors modeled for respective nets, circuit description, and noise viewpoint libraries (not specifically depicted). The noise analysis function includes a crosstalk noise induced delay calculation process 305 that operates in accordance with the discussions above with reference to FIG. 2. Further included and inter coupled to the induced delay calculation process 305 is a novel effective delta delay function (module or program) 307. The effective delta delay function 307 determines effective delay noise or delta delays due to crosstalk noise, utilizing timing windows and a net by net delay noise analysis technique, however the timing windows are used in an inventive manner. In one embodiment, victim and aggressor timing windows and their overlap properties are used such that for each victim net, only the contribution of delta delay that impacts the early and late arrival times at the path endpoints is taken into account (effective delta delay). This is further described below in detail with examples and the like. In one embodiment, the effective delta delays are then back-annotated 309, timing windows are enlarged accordingly and the STA engine may do one or more additional iterations, depending on when or the extent to which resultant timing windows may be changing. The result is a listing or indication of problem or failing paths due to failure to meet timing constraints.

The method implemented is one of reducing false timing problems resulting from pessimism in noise aware static timing analysis. The method initially or first performs noise aware static timing analysis using effective delay noise calculations on an interconnect system to identify failing paths corresponding to the semiconductor interconnect system. In overview, the performing noise aware static timing analysis using effective delay noise calculations further comprises determining one or more effective adjustments to respective timing windows for corresponding victim nets based on when, within the respective timing window an action of one or more aggressors occurs. This may further comprise iteratively performing noise aware static timing analysis augmented with effective delay noise analysis using adjusted timing windows corresponding to the effective adjustments to respective timing windows. Note the number of failing paths will be significantly smaller than in the analysis process described above with reference to FIG. 2, however these paths may still include undue pessimism.

Thus a further path based process 311 can be performed on various of the failing paths. The path based delay noise analysis 311 is a path based method in contrast to the typical net based method. In this approach, the analysis is done on one signal path at a time. The process at 311 can extract critical paths or process all paths depending on resources that are available and the like. The path based approach essentially eliminates the timing window for the victim that results from multiple paths traversing the same net and thus allows analysis with a deterministic switching time which reduces pessimism significantly. One difficulty in this approach is the necessity of a global optimization on the entire path. For example a worst case situation of switching all possible aggressors on one net of the path or victim path, may not guarantee a worst case delay impact on the overall path. This is solved with various novel uncertainty propagation techniques which results in conservative and reduced pessimism results. Furthermore this technique can be iteration-less and a conservative and reduced pessimism path delay with crosstalk noise impact is found with no iterations. The details of the path based delay noise analysis will be explained below in detail.

In any event, the module or process 311 performs path based delay noise analysis on a plurality of the failing paths to eliminate false failing paths corresponding to at least a portion of the failing paths identified with the effective delta delay process. The process of performing path based delay noise analysis further comprises determining a switching time window for a victim, where the switching time window is determined for and uniquely corresponds to a particular path through the victim. The performing path based delay noise analysis advantageously further comprises determining an uncertainty in the switching time window based on when within the switching time window an action of one or more aggressors occurs. Note that the system and methodology of FIG. 3 can be advantageously embodied in a software program comprising software instructions that when executed by a computer result in the performing the noise aware static timing analysis using effective delay noise and the performing the path based delay noise analysis.

Figure 4:
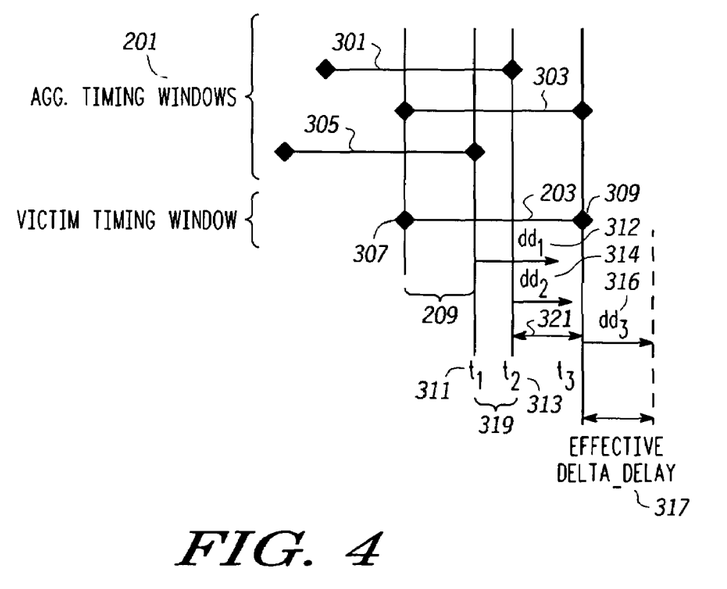
FIG. 4 illustrates an exemplary determination of effective delta delay given victim and aggressor timing windows as may be performed in the FIG. 3 system.

Referring to FIG. 4 a diagram that illustrates an exemplary determination of effective delta delay will be discussed and described. Note that this exemplifies the process that can be employed in the FIG. 3 system and shows the same situation for the same victim as illustrated in FIG. 2, i.e. with the aggressor timing windows 201 and victim timing window 203 where all timing windows overlap in the region 209.

As discussed earlier, the final step of static timing analysis is to obtain the early and late arrival times at the timing check points, and compare them with the required times at these points. Therefore, what one should worry about in noise aware STA is the actual impact of crosstalk induced delay to the early and late arrival times. The effective delta delay technique is driven by this observation. Referring to FIG. 4, the three aggressor nets (timing windows 301, 303, 305 and the victim net (timing window 203 starting at boundary 307 and ending at boundary 309) can switch together in the first over lapping region 209 resulting in all three aggressors possibly impacting the delay of the victim net in a worst case manner. However, observe that the latest time point or boundary around which these nets should switch to be able to realize this impact on the victim net is t1 311. In other words, the path in which the victim net is switching around time t1 is the latest path through this net that can be impacted by all three aggressors. If the delta_delay 312 due to these three aggressors is dd1, then the switching time of the victim net will be delayed to t1+dd1. Furthermore, only if t1+dd1>t3 309 (end of the victim timing window 203), will this have an impact on the late arrival point of the victim net timing window by the amount t1+dd1−t3.

Similarly, other possibilities are when aggressors with timing windows 301 and 303 switch together with the victim around time t2 313 with a resulting noise induced delay dd2 314 and when aggressor with corresponding timing window 303 switches together with the victim around time t3 309 with resulting noise induced delay dd3 316. The effective delta delay, which is the maximum impact of all possible scenarios to the late arrival time of the timing window is given by an expression, i.e. maximum over i of (ti+ddi−tend):

$$(\max)|_i((t_i+dd_i-t_{end}), \quad \text{EQ. 1}$$

where ti is the latest possible impact time for over lapping region or scenario i, ddi is the crosstalk noise induced delay in scenario i and tend is the late arrival time of the victim net window. Note that a similar argument holds for delay decrease (early arrival time) cases. When compared to conventional delay noise analysis, this technique results in the back-annotation of effective delta delay 317, in this example dd3 316 instead of $dd1 312. Furthermore the effective delta delay method is computationally efficient and readily implemented and thus readily improves the conventional noise aware STA methodology.

The method of reducing pessimism in cross talk noise aware static timing analysis discussed above includes providing a victim timing window 203 corresponding to a victim and providing at least one aggressor timing window (3 depicted 301, 303, 305) corresponding to at least one aggressor. Then comparing the victim timing window with the aggressor timing windows to identify overlapping regions 209, 319, 321 and determining an impact on victim timing (delta delay) of an action, e.g. switching, by the at least one aggressor that occurs during the overlapping region and determining an effective delta delay corresponding to any portion of the impact on victim timing that extends beyond the victim timing window (see expression above for effective delta delay. Given the effective delta delay the method further adjusts the victim timing window to include the effective delta delay to provide an adjusted victim timing window.

The method of determining the effective delta delay generally comprises adding the impact to a boundary of the overlapping region and subtracting a boundary of the victim timing window to provide the effective delta delay, e.g. t1+dd1−tend. Note that adjusting the victim timing window to include the effective delta delay to provide an adjusted victim timing window enlarges the adjusted victim timing window and increases a late arrival time of paths through the victim. Similarly the adjusting the victim timing window to include the effective delta delay to provide an adjusted victim timing window enlarges the adjusted victim timing window and reduces an early arrival time of paths through the victim when early arrival times are being analyzed or evaluated. Given the adjusted victim timing window the remaining processes using the adjusted victim timing window can be repeated. Using this approach the number of false timing problem indications in a timing analysis of an interconnect system can be reduced.

As noted above this method can be used when a plurality of aggressor timing windows corresponding respectively to a plurality of aggressors is provided. In this instance, the victim timing window is compared with the plurality of aggressor timing windows to identify a plurality of overlapping regions, where each of the plurality of overlapping regions corresponds to one or more of the plurality of aggressor timing windows. Then the method determines a plurality of impacts delta delays on victim timing of or resulting from actions, e.g. switching by one or more of the plurality of aggressors corresponding to and occurring during each of the plurality of overlapping regions and selects as the effective delta delay the largest portion of the plurality of impacts on victim timing that extends beyond the victim timing window.

Figure 5:
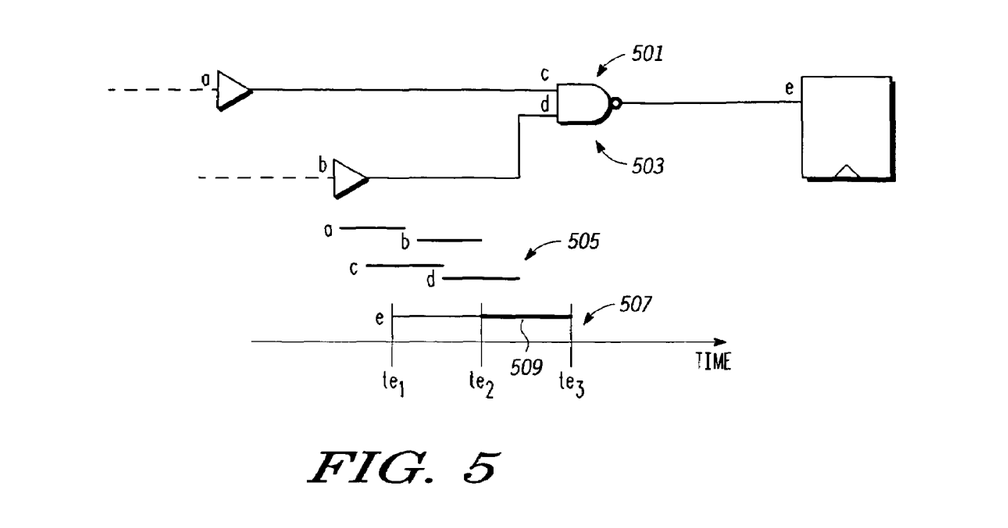
FIG. 5 illustrates another exemplary determination of effective delta delay.

Referring to FIG. 5 another exemplary determination of effective delta delay will be discussed and described. The effective delta delay techniques are concerned with the delay noise impact on the min (early) and max (late) arrival time points on a net. This approach assumes that the timing paths that correspond to these min and max arrival times propagate to the end points where final timing checks will be made. There can be situations where this technique encounters various timing exceptions (i.e., false and/or multicycle paths) in which case further refinements can be appropriate. Suppose that there are two paths -a-c-e 501 and -b-d-e 503 coming into the same endpoint e as shown in FIG. 5.

The timing windows 505 at a, b, c, d, e are also depicted. As can be seen, the -a-c-e path 501 is earlier than the -b-d-e path 503, therefore making the -b-d-e path 503 the critical one of the two in case of a setup analysis. If we look at the contribution of the two paths to the timing window at e 507, we can see that the -b-d-e path 503 is contributing to the later portion of this window 509 (bold region te2-te3). If the paths through b to e, i.e. -b-d-e 503, are false and/or multicycle paths then they are not important to be checked against the required time at e. If the effective delta delay method is used on net e and tend=te3 in the above expression (EQ. 1), the result can provide an improper indication of effective delta delay, e.g. under-estimation of the "important" delta_delay. As can be seen in FIG. 5, tend=te2 as this is the max arrival time that matters at the end point e given false paths.

Therefore, if a net is part of false/multicycle paths, for effective delta delay method to be conservative, an internal point in the timing window which marks the max arrival time of the non-false/multicycle paths can be found and declared as the tc (critical time point). Thus the expression above is transformed to effective delta delay=max over i (ti+ddi−tc).

Figure 6:
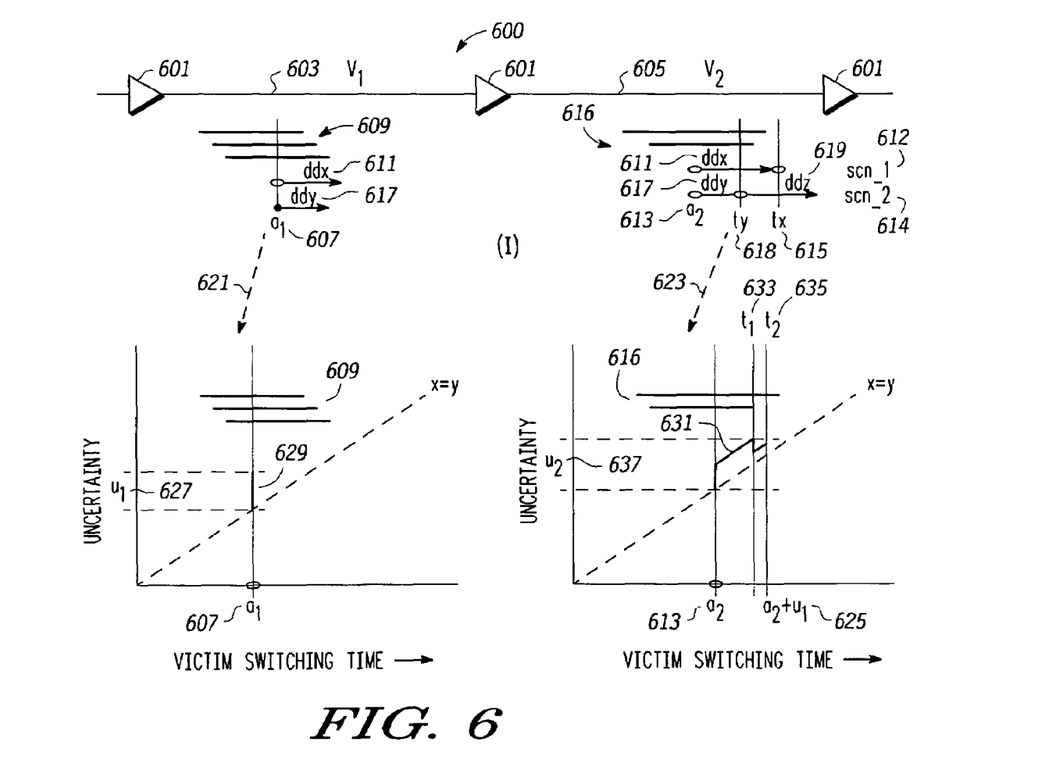
FIG. 6 illustrates an example of using path based delay determination as may be performed in the FIG. 3 system.

Referring to FIG. 6 an example of using path based delay determination as may be performed in the FIG. 3 system will be described and discussed. Additional pessimism reduction in noise aware STA can be provided if the static nature of the above techniques are removed and a more dynamic or situation specific analysis is performed. Elimination of iterations may also be beneficial. This can be accomplished using path based delay determination, where the analysis is performed on a path by path basis instead of the net by net approaches described above. If we look at a timing path for setup analysis, it contains the launch clock path and the signal path. The arrival times on the nets for a particular path need not be represented as windows as they are deterministic, i.e. with a known starting point and conditions. With the purpose of keeping the complexity of the problem to a manageable level, even if the aggressor net timing windows remain as "normal" timing windows obtained from STA; a significant pessimism reduction in delay noise calculation can be expected as the timing windows of the victim path nets are reduced to deterministic single time points.

Apart from pessimism reduction, another appealing property of path based delay noise analysis is that it allows noise-aware timing of a given path in a single pass, i.e. without iterations. One path based delay noise analysis, i.e. solution of realizing this iteration free computation is illustrated in FIG. 6. The exemplary path or portion of a path 600 of FIG. 6 includes three gates 601 with intervening nets v1 603 and v2 605. Since a particular path is being analyzed the switching point of net v1 can be found to be a1 607 which aligns with all three aggressors 609 at time a1. Suppose the noise induced delay pushes or delays this time by ddx 611. As net v2 605 is being analyzed, if we consider the hypothetical delay change ddx in v1 the switching point of v2 initially determined to be a2 613 is first moved by ddx to tx 615 in scenario 1 612. Now, v2 aligns with none of its aggressors 616 as shown. However this approach to iteration-less analysis may not always be conservative. Consider the case, scenario 2 614 where for v1, only two of the possible three aggressors 609 switch and that this moves the switching point of v1 603 by less than ddx 611, e.g. ddy 617. Now, v2 605 will be shifted less, e.g. ddy to ty 618 and thus may align with all its aggressors 616, resulting in a greater noise aware delay ddz 619 for this 2-net path. Thus to get rid of iterations the delay noise for the path (rather than individual nets) must be maximized. This is done through an uncertainty propagation technique as illustrated in the graphs 621, 623 of switching time versus uncertainty for, respectively, the victim nets v1 603 and v2 605 of FIG. 6.

Generally the graphs depict or facilitate a method of reducing pessimism in cross talk noise aware static timing analysis. The method may be utilized to reduce a number of false timing problem indications in a timing analysis of an interconnect system. The method includes providing at least one aggressor timing window 609 corresponding to at least one aggressor (three shown) and providing, for a victim, a switching time window for a path through the victim. Note that in general the switching time window will include a switching time, e.g. a1 607 as well as an uncertainty or uncertainty factor (see for example a2+u1 625). This switching time window corresponds to a particular path and will vary with different paths. In the example of FIG. 6, v1 is the first net on the path 600 and thus the switching time window is a point in time a1 607. The method further includes determining an uncertainty u1 627 in a switching time for the victim resulting from an action, e.g. switching logic levels, by the at least one aggressor or combination of actions by a combination of aggressors that occurs during the switching time window. The method may further comprise adding the uncertainty to the switching time a1 for the victim net v1 to provide an adjusted switching time window for the victim and thus the path through the victim. This is not specifically depicted but amounts to adding the uncertainty to the switching time for a subsequent victim net, e.g. v2 as shown by a2+u1 625.

The graphs 621, 623 illustrate determining an uncertainty profile for respective nets v1 603, v2 605. Graph 621 assumes that v1 it is the first net of the path (primary input or first net after clock source) and has a deterministic single switching point a1 i.e. there is no uncertainty in switching time a1. The x and y axis represent the arrival time at the corresponding net, i.e. switching time for the net, with and without additional uncertainty at this stage, respectively. Corresponding aggressor timing windows that can impact the arrival time at this stage are also shown, e.g. aggressor timing windows 609 for v1 and windows 616 for v2. Since a1 aligns with all 3 aggressors, the uncertainty 627 is the delta delay referenced to the switching time 629 that can be induced by all 3 aggressors. The highest and the lowest y-coordinates of this uncertainty profile is defined as the uncertainty at this stage, shown as u1 627 on the y-axis.

The no-noise arrival time and thus switching time at v2 is a2 613. The upstream uncertainty u1 627 is added to a2 to represent the total uncertainty up to this point as shown in the x-axis as a2+u1 625. The uncertainty profile 631 of v2 from a2 to a2+u1 is shown. From a2 to t1 633 the uncertainty is the delta delay from or due to 2 aggressors as shown and from t1 to the lesser of t2 635 or a2+u1, it is the delta delay from 1 aggressor. The uncertainty at this stage or net v2 is again determined by the max and min y-coordinates of the uncertainty profile and represented as u2 637 on the y-axis. If another net v3 is present in the path u2 would be added to the switching time a3 for that net and an analogous analysis would occur. Thus this propagation continues until the path end point is reached. Using this method, the uncertainty window on the victim path nets can only enlarge as the uncertainty is propagated down the path, taking into account all aggressor switching possibilities. The max point of the final uncertainty window obtained at the path end point gives the worst case arrival time for the path in one pass. An implementation of this technique requires very little overhead as the "uncertainty profile" information on each net is already generated as part of the traditional delay noise analysis when, for example a scan-line algorithm is used to obtain the worst case aggressor set.

Thus graph 621 shows providing, for a victim, a switching time window that comprises a point in time a1 607 and the determining an uncertainty in victim switching time further comprises determining an uncertainty due to actions or switching of a plurality of aggressors at that point in time. The determining an uncertainty in victim switching time further comprises determining an uncertainty profile 629, 631 from actions by one or more of a plurality of aggressors that occur during the switching time window and selecting as the uncertainty a maximum magnitude of the uncertainty profile. As reflected in graph 623 adding the uncertainty to a switching time for a subsequent victim, provides a subsequent switching time window a2+u1 for the path through the subsequent victim v2. Note that adding the uncertainty to the switching time for the subsequent victim to provide the subsequent switching time window enlarges the subsequent switching time window and increases a late arrival time of the path through the subsequent victim. Similarly in early arrival analysis adding the uncertainty to the switching time for the subsequent victim to provide the subsequent switching time window enlarges the subsequent switching time window and reduces an early arrival time of the path through the subsequent victim.

Another approach to maximizing the arrival times (late or early) when the victim is one of a plurality of victims comprising the path includes maximizing, using integer linear programming (ILP) techniques, an uncertainty in a last switching time for a last victim in the path. More particularly the following equations are solved.

$$\max(t_n) \tag{1}$$

$$t_i = t_{i-1} + \sum_k a_{ik} \cdot d_{ik} + d_i \tag{2}$$

$$0 \le a_{ik} \le \alpha_{ik} \tag{3}$$

$$0 \le \alpha_{ik} \le 1 \tag{4}$$

$$\alpha_{ik} W s_{ik} \le t_i \le \alpha_{ik} W e_{ik} + (1 - \alpha_{ik})T \tag{5}$$

$$t_i \le (1 - \alpha_{ik}) W s_{ik} + \beta_{ik} T \tag{6}$$

$$t_i \ge (1 - \alpha_{ik}) W e_{ik} - \gamma_{ik} T \tag{7}$$

$$\alpha_{ik} \le \beta_{ik} \le 1 \tag{8}$$

$$\alpha_{ik} \le \gamma_{ik} \le 1 \tag{9}$$

-continued $$1 \le \beta_{ik} + \gamma_{ik} \le \alpha_{ik} + 1 \tag{10}$$

$$a, \alpha, \beta, \gamma \in \{0, 1\} \tag{11}$$

This is an integer-linear programming formulation of the optimization problem and can be solved with known techniques. The path of interest has "n" stages or nets, ti is arrival time of a signal on stage i of the path, dik is delta delay contribution from kth aggressor of stage i, di is the no-noise delay of stage i, and T is a very big number in this context. Suppose that a timing window from Wsik to Weik represents the timing window of the kth aggressor net at the ith victim net on the path we are calculating. The integer-linear programming equations and inequalities when solved, will solve our optimization or maximization problem.

When ti is between Wsik and Weik, (window boundaries, start and end points) this aggressor may contribute to delta delay. When ti is smaller than Wsik or larger than Weik, this aggressor cannot contribute. Lines (1-2) of the equations setup the problem (maximize arrival time at nth (i.e., last net of the path) net). Also the definition of ti (ti−1+ith gate delay+any crosstalk delay contribution from possible k aggressors) is provided. In lines (3-4): alpha_ik and a_ik are integers which can take on 0 or 1. Alpha_ik is 1 when ti is between Wsik and Weik, so it represents whether the victim switching time is intersecting the aggressor timing window and a_ik is 0 when alpha_ik is 0 and a_ik can be 0 or 1 when alpha_ik is one. So this variable represents whether to choose the kth aggressor to switch when it is possible to choose it. In line (5) the inequality defines the relation between ti, Wsik, Weik and alpha_ik. For example when alpha_ik is 1, this says that ti is between Wsik and Weik. When alpha_ik is 0, this says that ti is between 0 and some big number. Lines (6-7): When alpha_ik is 0, line (5) just says ti is between 0 and some big number. But we need ti to be either less than Wsik or more than Weik when alpha_ik is 0 (i.e., ti is not intersecting the aggressor window). These two inequalities represent this. Lines (8-9-10): These define relations between alpha, beta, gamma (beta and gamma are used in lines 6-7). When alpha is 1, both beta and gamma are 1. When alpha is 0, one of beta or gamma is 1 and the other is 0.

Figure 7:
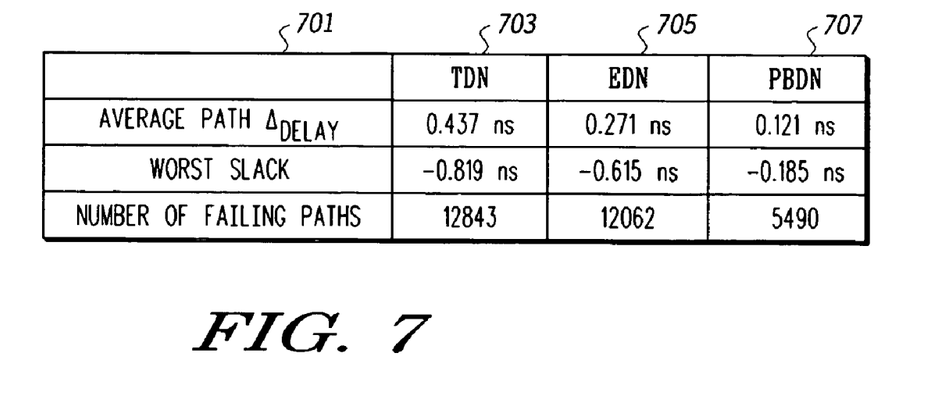
FIG. 7 shows a table comparing performance results for various timing analysis approaches.

Referring to FIG. 7 a table comparing performance results for various timing analysis approaches will be reviewed. The proposed techniques were evaluated on a 90 nm DSP block or IC. The block was synthesized of 90 nm standard cell library cells, and contains 56 k nets. The STA engine was a commercial tool (Primetime), and an internal proprietary tool (similar to Celtic or PTSI) was utilized as the crosstalk induced delay calculator. Timing libraries have been characterized at a typical corner (Vdd=1.1V, Temp=105 C) and interconnect extraction has also been done at the typical corner with commercial extraction tool Star-XT. The design has been timing and functional crosstalk noise optimized. In other words, no timing violations without crosstalk induced delay noise, and no functional crosstalk noise violations (i.e., glitch noise) exist.

We evaluated average path delta delay, worst slack, and number of failing paths 701 using delay noise analysis (TDN) 703, effective delay noise analysis (EDN) 705 and path based delay noise analysis (PBDN) 707 on this block. Since it may not be feasible and is not necessary to run path based delay noise analysis on all paths of the design or IC; the paths on which this technique will be applied are chosen based on the traditional delay noise analysis. We chose 28 k paths (timing slack less than 0.2 ns, maximum 1000 paths per end point and maximum 10000 paths per clock group) and compared the results of the three noise aware STA techniques on these paths. As the data from FIG. 7 indicates, when crosstalk noise is considered under these circumstances the average path delta delay is reduced for 0.437 ns to 0.121 ns when comparing TDN to PBDN analysis, worst slack −0.819 ns using TDN 703 is reduced to −0.185 ns using PBDN 707, and the number of failing paths went from 12843 for TDN to 5490 for PBDN. This is a significantly more tractable situation for a designer to resolve.

The processes, apparatus, and systems, discussed above, and the inventive principles thereof are intended to and will alleviate problems caused by prior art crosstalk noise aware static timing analysis. Using these principles and concepts of determining effective delta delays or using a path based approach for analyzing timing in interconnect systems will simplify and enhance efficiency of semiconductor IC design and layout processes thus facilitate quicker time to market objectives.

Various embodiments of methods, systems, and apparatus for reducing pessimism in noise aware static timing analysis so as to facilitate and provide for more accurate timing problem indications have been discussed and described. It is expected that these embodiments or others in accordance with the present invention will have application to many IC interconnect design and evaluation processes that will be beneficial to designers, producers, and customers for the resultant ICs a like.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method of reducing pessimism in cross talk noise aware static timing analysis, the method comprising:
   providing a victim timing window corresponding to a victim;
   providing at least one aggressor timing window corresponding to at least one aggressor;
   comparing the victim timing window with the at least one aggressor timing window to identify an overlapping region;
   determining an impact on victim timing of an action by the at least one aggressor that occurs during the overlapping region and determining an effective delta delay corresponding to any portion of the impact on victim timing that extends beyond the victim timing window; and
   adjusting the victim timing window to include the effective delta delay to provide an adjusted victim timing window for use in the cross talk noise aware static timing analysis.

2. The method of claim 1 wherein the determining the effective delta delay further comprises adding the impact to a boundary of the overlapping region and subtracting a boundary of the victim timing window to provide the effective delta delay.

3. The method of claim 2 wherein the adjusting the victim timing window to include the effective delta delay to provide an adjusted victim tinting window enlarges the adjusted victim timing window and increases a late arrival time of paths through the victim.

4. The method of claim 2 wherein the adjusting the victim timing window to include the effective delta delay to provide an adjusted victim timing window enlarges the adjusted victim timing window and reduces an early arrival time of paths through the victim.

5. The method of claim 1 wherein the providing a victim timing window further comprises providing the adjusted victim timing window and repeating the remaining processes using the adjusted victim timing window.

6. The method of claim 1 wherein the adjusting the victim timing window to include the effective delta delay to provide an adjusted victim timing window is utilized to reduce a number of false timing problem indications in a timing analysis of an interconnect system.

7. The method of claim 1 wherein:
   the providing at least one aggressor timing window further comprises providing a plurality of aggressor timing windows corresponding respectively to a plurality of aggressors;
   the comparing the victim timing window with the at least one aggressor timing window further comprises comparing the victim timing window with the plurality of aggressor timing windows to identify a plurality of overlapping regions, each of the plurality of overlapping regions corresponding to one or more of the plurality of aggressor timing windows;
   the determining further comprises determining a plurality of impacts on victim timing of actions by one or more of the plurality of aggressors corresponding to and occurring during each of the plurality of overlapping regions and selecting as the effective delta delay the largest portion of the plurality of impacts on victim timing that extends beyond the victim timing window.

8. A method of reducing pessimism in cross talk noise aware static timing analysis, the method comprising:
   providing at least one aggressor timing window corresponding to at least one aggressor;
   providing, for a victim, a switching time window for a path through the victim; and
   determining an uncertainty in a switching time for the victim resulting from an action by the at least one aggressor that occurs during the switching time window, the uncertainty in a switching time for the victim used in the cross talk noise aware static timing analysis.

9. The method of claim 8 further comprising adding the uncertainty to the switching time for the victim to provide an adjusted switching time window for the victim and the path through the victim.

10. The method of claim 8 wherein the providing, for a victim, a switching rime window further comprises providing a point in time and the determining an uncertainty in victim switching time further comprises determining an uncertainty due to actions of a plurality of aggressors at that point in time.

11. The method of claim 8 wherein the determining an uncertainty in victim switching time further comprises determining an uncertainty profile from actions by one or more of a plurality of aggressors that occur during the switching time window and selecting as the uncertainty a maximum magnitude of the uncertainty profile.

12. The method of claim 8 further comprising adding the uncertainty to a switching time for a subsequent victim to provide a subsequent switching time window for the path through the subsequent victim.

13. The method of claim 12 wherein the adding the uncertainty to the switching time for the subsequent victim to provide the subsequent switching time window enlarges the subsequent switching time window and increases a late arrival time of the path through the subsequent victim.

14. The method of claim 12 wherein the adding the uncertainty to the switching time for the subsequent victim to provide the subsequent switching time window enlarges the subsequent switching time window and reduces an early arrival time of the path through the subsequent victim.

15. The method of claim 8 wherein the victim is one of a plurality of victims comprising the path and the method further comprises maximizing, using integer linear programming techniques, an uncertainty in last switching time for a last victim in the path.

16. The method of claim 8 wherein the determining an uncertainty in a switching time for the victim is utilized to reduce a number of false timing problem indications in a timing analysis of an interconnect system.

17. A method of reducing false timing problems resulting from pessimism in noise aware static timing analysis, the method comprising:

first performing noise aware static timing analysis using effective delay noise calculations on an interconnect system to identify failing paths corresponding to the semiconductor interconnect system; and then performing path based delay noise analysis on a plurality of the failing paths to eliminate false failing paths corresponding to at least a portion of the failing paths, the path based delay noise analysis including determining an uncertainty in a switching time window for each of the failing paths.

18. The method of claim 17 wherein the first performing noise aware static timing analysis using effective delay noise calculations further comprises determining one or more effective adjustments to respective timing windows for corresponding victim nets based on when, within the respective timing window an action of one or more aggressors occurs.

19. The method of claim 18 further comprises iteratively performing noise aware static timing analysis augmented with effective delay noise analysis using adjusted timing windows corresponding to the effective adjustments to respective timing windows.

20. The method of claim 17 wherein the performing path based delay noise analysis further comprises determining the switching time window for a victim, the switching time window determined for a failing path through the victim.

21. The method of claim 20 wherein the performing path based delay noise analysis further comprises determining the uncertainty in the switching time window based on when within the switching time window an action of one or more aggressors occurs.

22. The method of claim 17 embodied in a software program stored on computer readable media, the software program comprising software instructions that when executed by a computer result in the performing the noise aware static timing analysis using effective delay noise and the performing the path based delay noise analysis.

* * * * *

UNITED STATES PATENT AND TRADEMARK OFFICE
CERTIFICATE OF CORRECTION

| | | |
|---|---|---|
| PATENT NO. | : 7,251,797 B2 | Page 1 of 1 |
| APPLICATION NO. | : 10/994858 | |
| DATED | : July 31, 2007 | |
| INVENTOR(S) | : Becer et al. | |

It is certified that error appears in the above-identified patent and that said Letters Patent is hereby corrected as shown below:

Column 14 line 66 claim 10 please delete "rime" and insert --time--

Signed and Sealed this

Twentieth Day of November, 2007

JON W. DUDAS
*Director of the United States Patent and Trademark Office*